(12) United States Patent
Choi et al.

(10) Patent No.: US 7,990,794 B2
(45) Date of Patent: Aug. 2, 2011

(54) SEMICONDUCTOR APPARATUSES AND METHODS OF OPERATING THE SAME

(75) Inventors: Sang-moo Choi, Yongin-si (KR);
Won-joo Kim, Hwaseong-si (KR);
Tae-hee Lee, Yongin-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 111 days.

(21) Appl. No.: 12/585,536

(22) Filed: Sep. 17, 2009

(65) Prior Publication Data
US 2010/0118634 A1 May 13, 2010

(30) Foreign Application Priority Data
Nov. 10, 2008 (KR) .................. 10-2008-0111215

(51) Int. Cl.
*G11C 7/06* (2006.01)

(52) U.S. Cl. ................... 365/218; 365/185.24
(58) Field of Classification Search .......... 365/218, 365/185.24
See application file for complete search history.

(56) References Cited

U.S. PATENT DOCUMENTS
7,630,266 B2 * 12/2009 Incarnati et al. ............ 365/211
2010/0095047 A1 * 4/2010 Grandin ..................... 711/102

FOREIGN PATENT DOCUMENTS
| JP | 05-028761 | 2/1993 |
| JP | 05-205473 | 8/1993 |
| KR | 10-2008-0018040 | 2/2008 |

* cited by examiner

*Primary Examiner* — Michael T Tran
(74) *Attorney, Agent, or Firm* — Harness, Dickey & Pierce, PLC

(57) ABSTRACT

A method of operating a semiconductor device is provided including applying a constant source voltage to a source line.

23 Claims, 11 Drawing Sheets

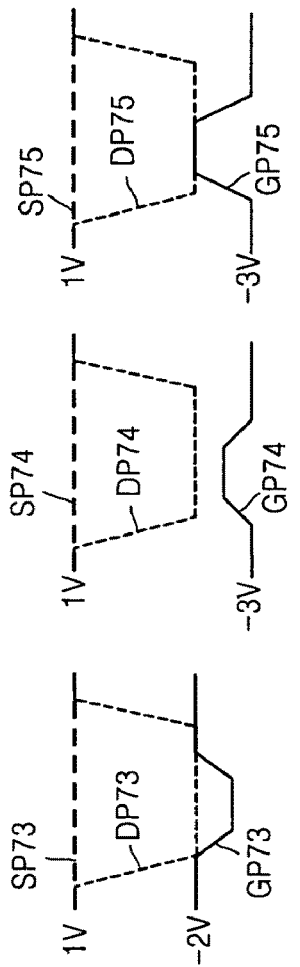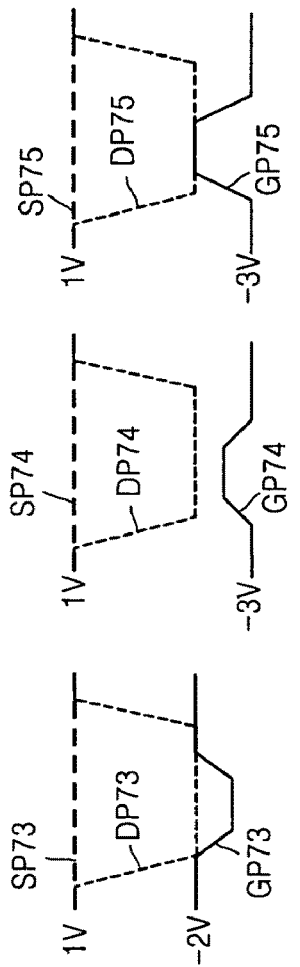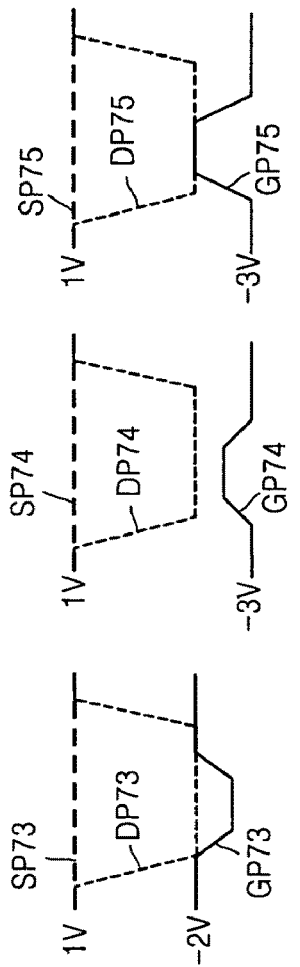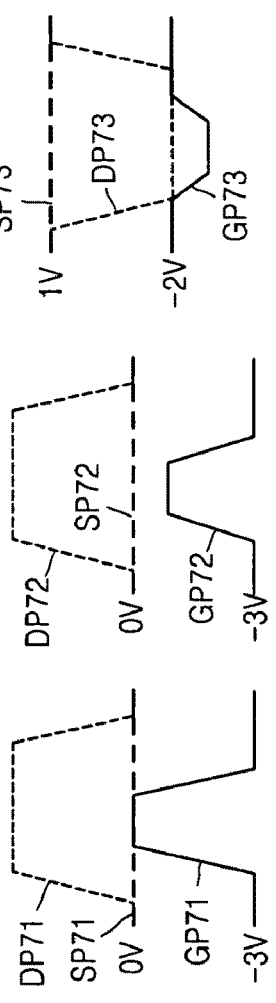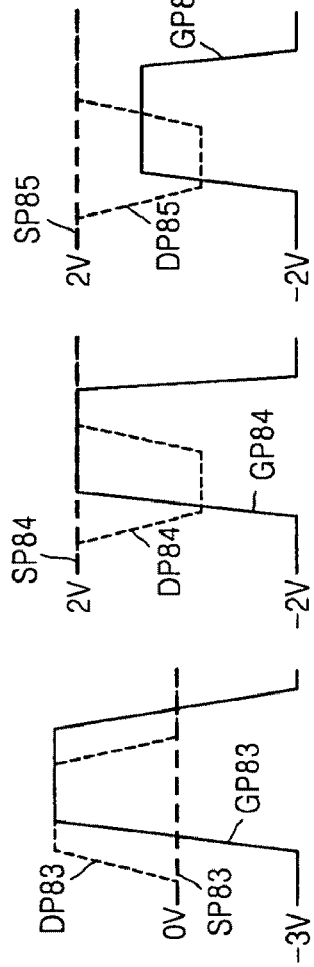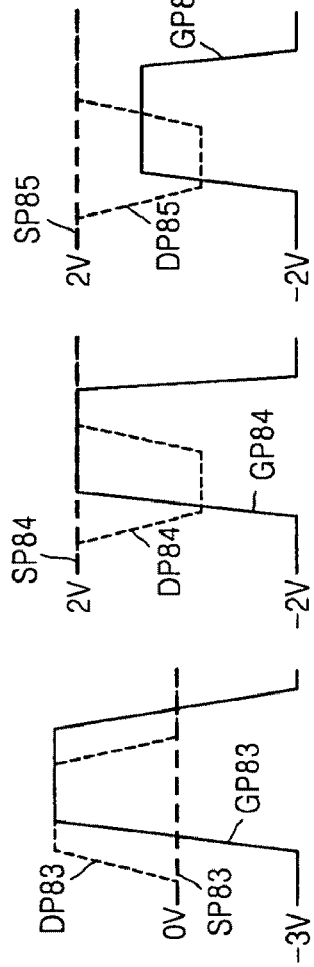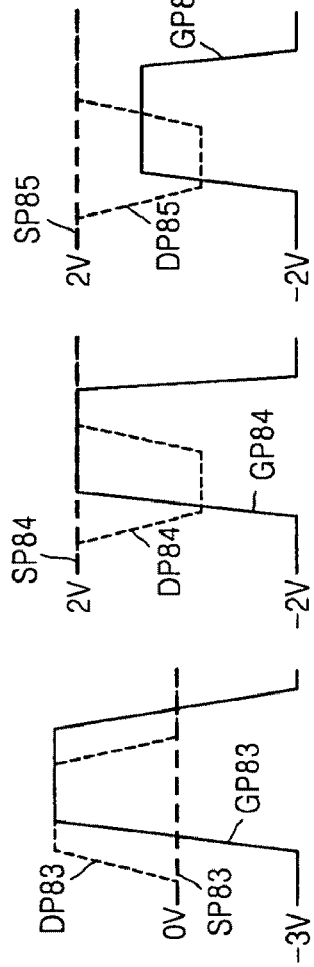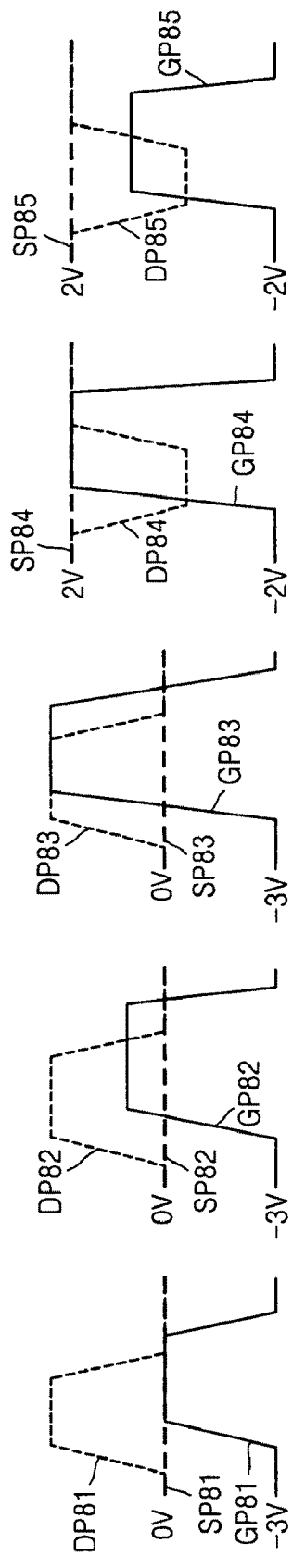

SEMICONDUCTOR APPARATUSES AND METHODS OF OPERATING THE SAME

CROSS-REFERENCE TO RELATED APPLICATIONS

This application claims priority under 35 U.S.C. §119 to Korean Patent Application No. 10-2008-0111215, filed on Nov. 10, 2008, in the Korean Intellectual Property Office (KIPO), the entire contents of which is incorporated herein by reference.

BACKGROUND

1. Field

Example embodiments relate to methods of operating semiconductor apparatuses, and more particularly, to methods of operating semiconductor apparatuses that include applying a constant source voltage to a source line.

2. Description of the Related Art

A conventional memory, (e.g., a DRAM) may include one transistor and one capacitor as a memory cell. However, there are limitations to the scalability of a conventional memory due to the capacitor, and in particular due to the size of the capacitor. As a result, a memory including one transistor (1T) and no capacitor as a memory cell, referred to as 'a capacitor-less memory or 1-T DRAM', has been studied. The 1-T DRAM may be simple to manufacture and may be manufactured with a greater integration density than a conventional DRAM.

SUMMARY

Example embodiments provide a method of operating a semiconductor device in which a source voltage applied to a source line is constantly maintained.

According to example embodiments, there is provided a method of operating a semiconductor device including a plurality of memory cells, each memory cell including a drain region, a source region, a floating body region, and a gate electrode, the method including: erasing at least one of the memory cells in an erase mode and setting a data value of the at least one memory cell to a first state, by transitioning a drain voltage pulse applied to the drain region from an enable voltage to a standby voltage and a gate voltage pulse applied to the gate electrode from an enable voltage to a standby voltage; writing to the at least one of the memory cells in a write mode and setting the data value of the memory cell to a second state, by transitioning a gate voltage pulse applied to the gate electrode from an enable voltage to a standby voltage and then a drain voltage pulse applied to the drain region from an enable voltage to a standby voltage; and applying a constant source voltage to the source region in the erase mode and the write mode, respectively. The method may include reading the data value of the at least one of the memory cells in a read mode. The source voltage may be a constant voltage in the read mode, or in the erase mode, write mode and hold mode.

The source voltage may be a ground voltage or a voltage other than a ground voltage. Each of a plurality of source lines of the semiconductor apparatus may be commonly connected to source regions of at least two of the plurality of the semiconductor devices. The source voltage may be applied via the commonly connected source line. In the erase mode and the write mode, the gate voltage pulse may be transitioned from the standby voltage to the enable voltage earlier than, the same time as, or later than when the drain voltage pulse is transited from the standby voltage to the enable voltage.

According to example embodiments a semiconductor apparatus is provided including: a plurality of memory cells each including a drain region, a source region, a floating body region, and a gate electrode; and a plurality of common source lines each commonly connected to source regions of at least two of the plurality of memory cells, where each memory cell is configured so that in an erase mode where a data value of each memory cell is changed to a first state, a drain voltage pulse applied to the drain region transitions from an enable voltage to a standby voltage, and then a gate voltage pulse applied to the gate region transitions from an enable voltage to a standby voltage, and in a write mode where the data value of each memory cell is changed to a second state, a gate voltage pulse applied to the gate electrode transitions from an enable voltage to a standby voltage, and then a drain voltage pulse applied to the drain region transitions from an enable voltage to a standby voltage, and a source voltage applied to the source region is constant in the erase mode and the write mode.

According to example embodiments a method of operating a 1T-DRAM is provided, the method including applying the constant source voltage in a write mode as in an erase mode.

BRIEF DESCRIPTION OF THE DRAWINGS

Example embodiments will be more clearly understood from the following brief description taken in conjunction with the accompanying drawings. FIGS. 1-20 represent non-limiting, example embodiments as described herein.

FIG. 1 is a cross-sectional diagram of a memory cell of an example 1T-DRAM semiconductor device according to example embodiments;

FIG. 2 is a cross-sectional diagram of write mode carrier generation in the memory cell of FIG. 1, according to example embodiments;

FIG. 3 is a cross-sectional diagram of carrier storage in the memory cell of FIG. 1 after the write operation of FIG. 2, according to example embodiments;

FIG. 4 is a cross-sectional diagram illustrating erase mode carrier removal in the memory cell of FIG. 1, according to example embodiments;

FIG. 5 is a circuit diagram of the memory cell of FIG. 1 according to example embodiments;

FIGS. 6 and 7 are circuit diagrams of arrays of the memory cell of FIGS. 1 and 5, according to example embodiments;

FIGS. 14A-14E are diagrams illustrating write mode voltage pulses according to example embodiments;

FIGS. 15A-15E are diagrams illustrating erase mode voltage pulses according to example embodiments;

FIGS. 19 and 20 are cross-sectional diagrams of an example memory cell of a 1T-DRAM according to example embodiments.

Figure 1:
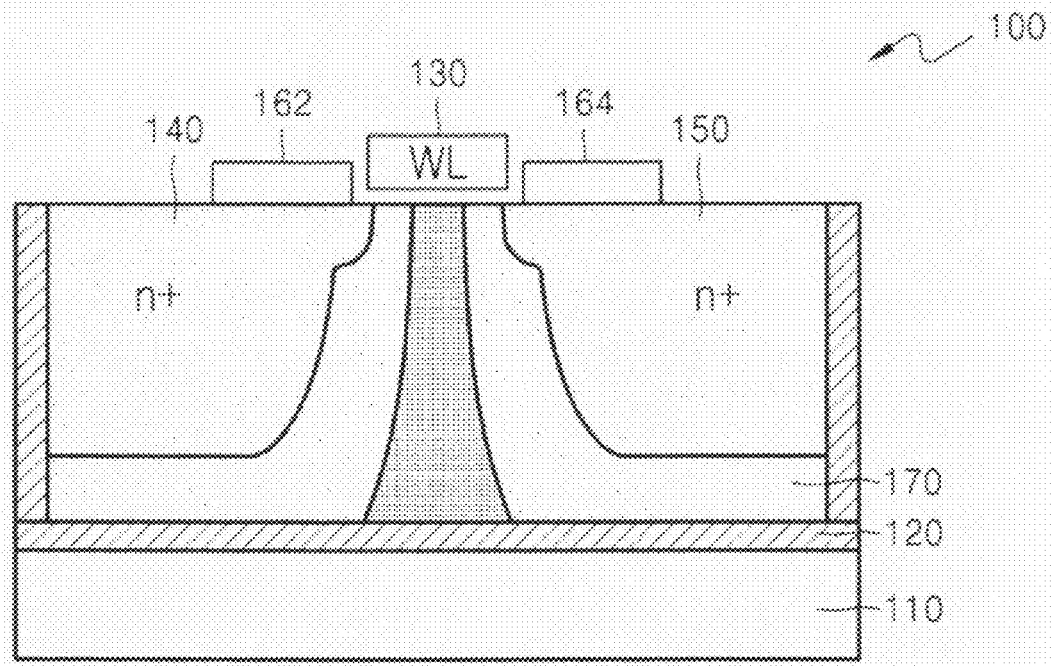

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of an example memory cell of a 1-transistor dynamic random access memory (1T-DRAM) device according to example embodiments. Referring to FIG. 1, a memory cell 100 of a 1T-DRAM may include an insulating layer 120 on a semiconductor substrate 110, a body region 170, a gate electrode 130, a source electrode 162, a drain electrode 164, a source region 140, and a drain region 150. The source region 140 and the drain region 150 may be doped with impurities. According to example embodiments, the source region 140 and the drain region 150 may be interchanged with each other, and the source electrode 162 and the drain electrode 164 may be interchanged with each other. For example, the semiconductor device of FIG. 1 may be bi-directional. A gate voltage, a drain voltage, and a source voltage, which are applied to the gate electrode 130, the source electrode 162, and the drain electrode 164, respectively, may be adjusted so that data can be written, erased, and/or read in the memory cell 100 of the 1T-DRAM device.

Figure 2:
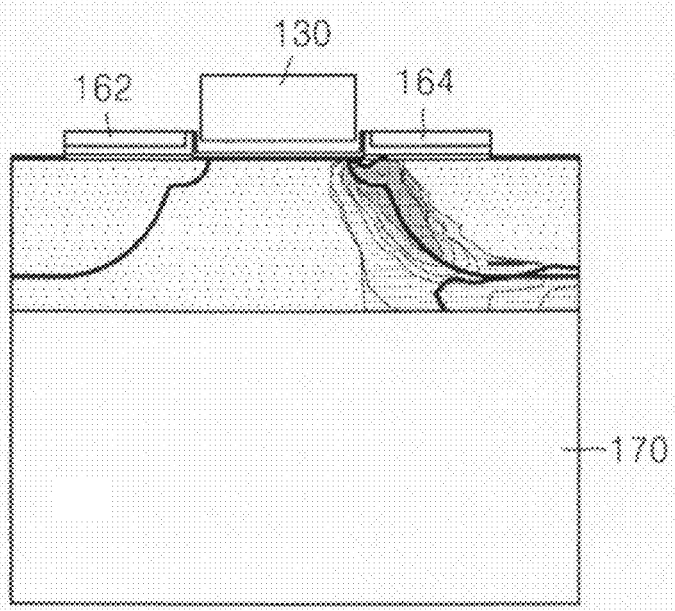
Figure 3:
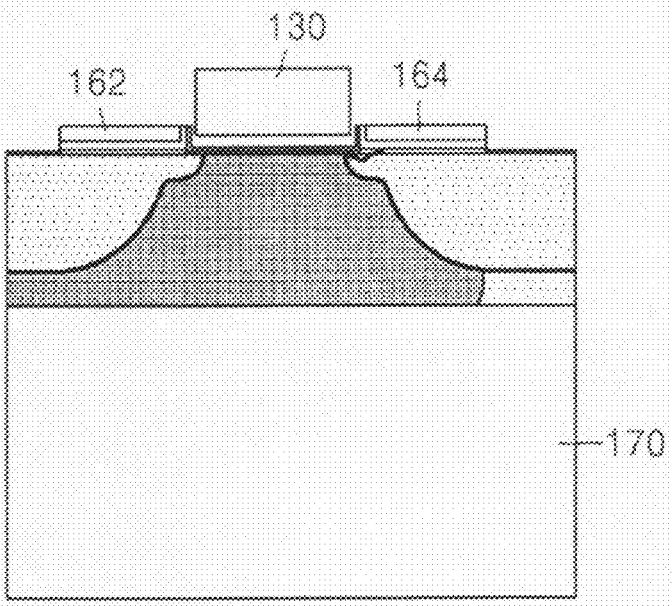
Figure 4:
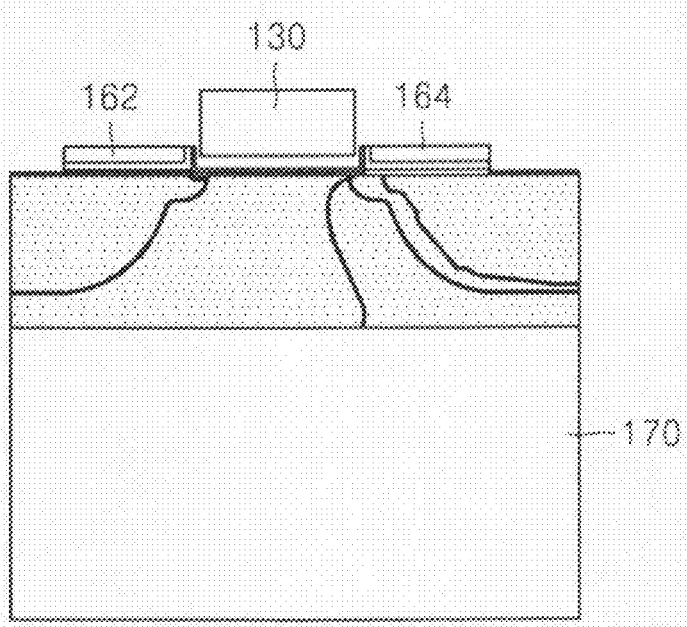

FIG. 2 is a cross-sectional diagram of write mode carrier generation in the memory cell of FIG. 1, according to example embodiments. FIG. 3 is a cross-sectional diagram of carrier storage in the memory cell of FIG. 1 after the write operation of FIG. 2, according to example embodiments. FIG. 4 is a cross-sectional diagram illustrating erase mode carrier removal in the memory cell of FIG. 1, according to example embodiments. Referring to FIGS. 1-4, in a write mode, a plurality of electron-hole pairs may be generated under a given voltage bias condition by impact ionization or avalanche breakdown in a portion of the memory cell where the body region 170 and the drain region 150 contact each other, shown as highly darkened and darkened areas in FIG. 2. The generated electrons may be moved into the drain region 150 and the generated holes (majority carriers) are moved into the body region 170, shown as a darkened area in FIG. 3, under the given voltage bias condition. In FIG. 3, the carrier concentration of a darkened area is higher than that of an area that is not darkened. When carriers are not generated in the write mode or are removed in an erase mode, carriers may not be stored in the body region 170, as illustrated in FIG. 4. In FIG. 4, absence of the darkened area indicates a low carrier concentration. When the body region 170 stores carriers, this may be considered as a data value of "1" of the memory cell 100 of the 1T-DRAM. On the other hand, when the body region 170 has no carriers stored, this may be considered as a data value of "0" of the memory cell 100 of a 1T-DRAM.

By controlling gate voltage, drain voltage, and source voltage, applied to the gate electrode 130, the drain electrode 162, and the source electrode 164, respectively, a write operation of a semiconductor device including a memory cell of a 1T-DRAM may be performed according to example embodiments of FIG. 2 and an erase or read operation of FIG. 4 may be performed. In an erase mode, the carriers stored in the body region 170 may be removed. The body region 170 after an erase operation is performed may be illustrated in FIG. 4. In a read mode, the amount of current flowing between the source region 140 and the drain region 150 may be measured and data may be read from the memory cell 100 of the 1T-DRAM. When the number of carriers stored in the body region 170 is large, the amount of current flowing between the source region 140 and the drain region 150 may be large. When the number of carriers stored in the body region 170 is small, the amount of current flowing between the source region 140 and the drain region 150 may be small.

Figure 5:
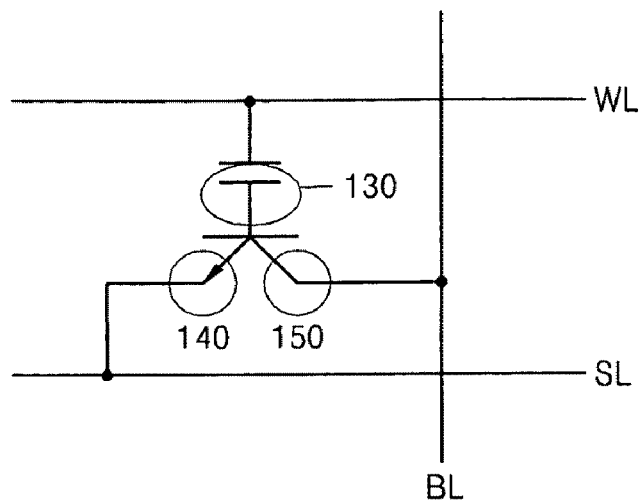

FIG. 5 is a circuit diagram of the memory cell of FIG. 1 according to example embodiments. Referring to FIG. 5, the source region 140 may be connected to a source line SL, and the drain region 150 may be connected to a bit line BL. The source region 140 may be supplied with a source voltage via the source line SL and the drain region 150 may be supplied with a drain voltage via the bit line BL. The gate electrode 130 may be connected to a word line WL and be supplied with a gate voltage via the word line WL.

Figure 6:
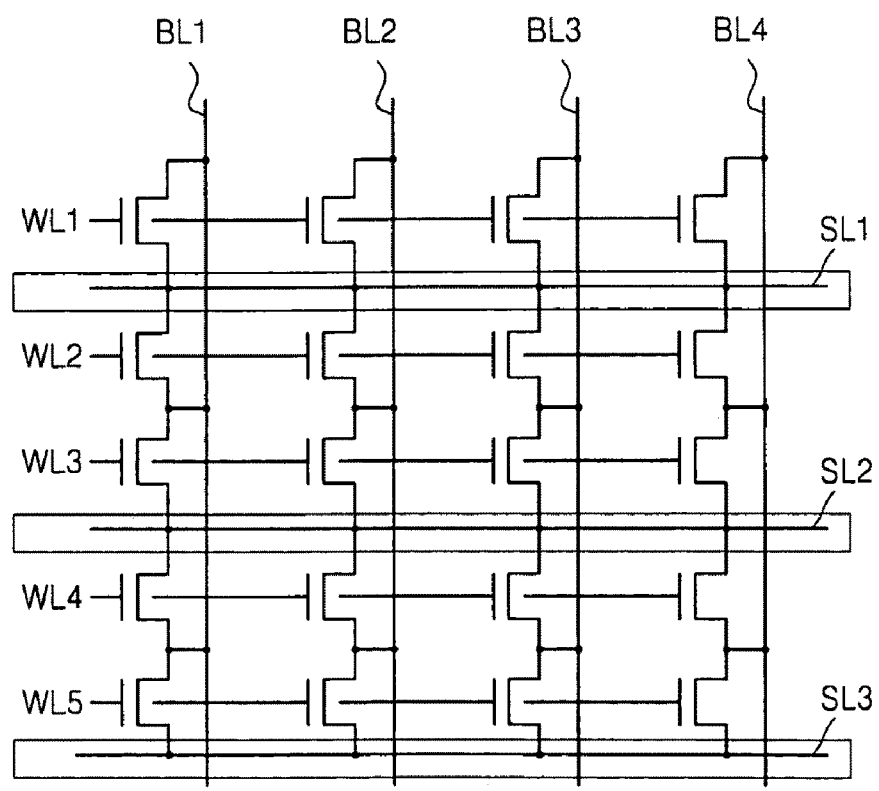

FIG. 6 is a circuit diagram of an array of the memory cells of FIGS. 1 and 5, according to example embodiments. Referring to FIG. 6, bit lines BL1-BL4 may be connected to a plurality of strings, each string including a plurality of memory cells, where the memory cells may be serially connected to one another. Word lines WL1-WL5 may be each connected to gate electrodes of memory cells that belong to different strings. Source lines SL1-SL3 may be each commonly connected to two adjacent memory cells that belong to a single string and each source line may connect adjacent word line pairs. The source lines SL1-SL3 may be called common source lines. When each of the source lines SL1-SL3 are commonly connected to two memory cells of a 1T-DRAM, the memory cells may be arranged in a 4F2 structure.

Figure 7:
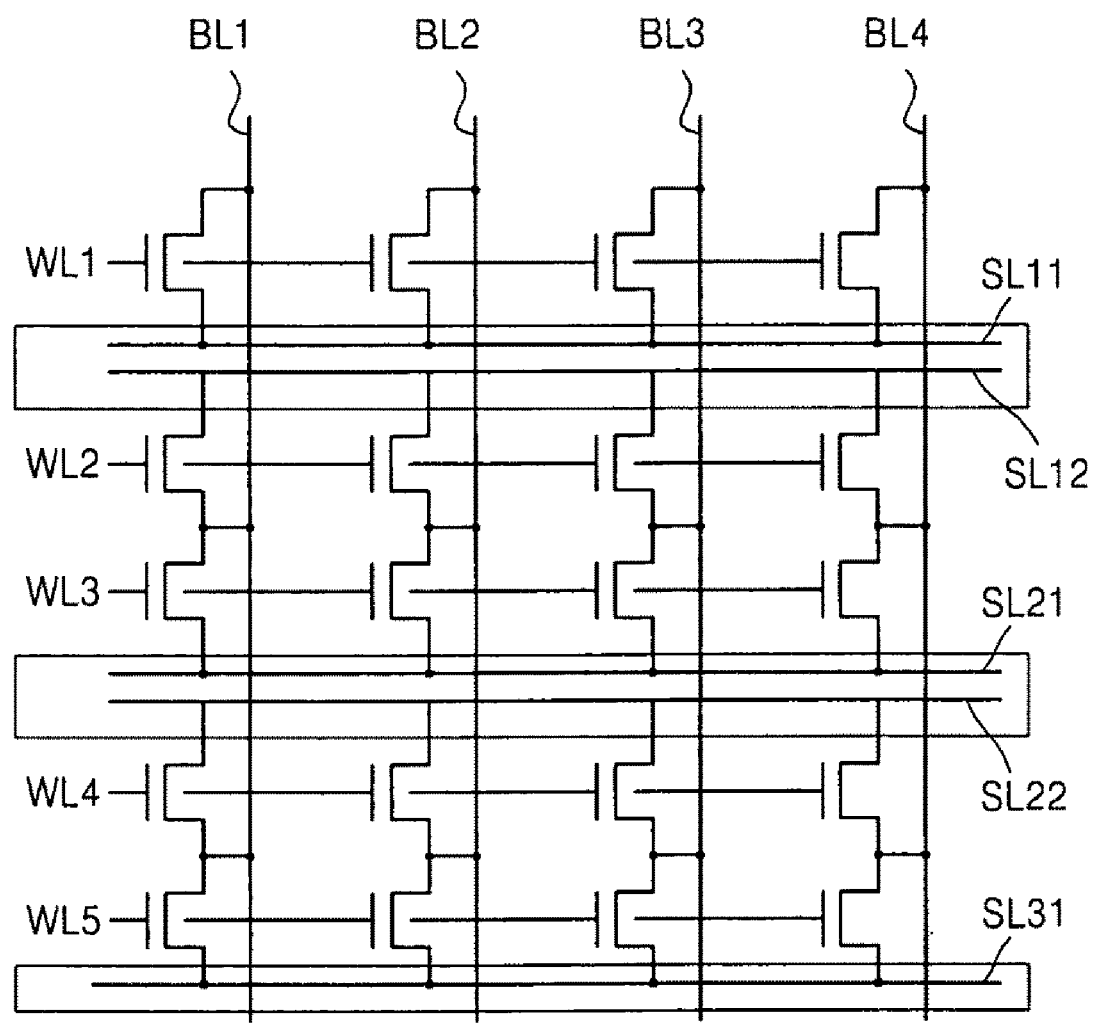

FIG. 7 is a circuit diagram of an array of the memory cells of FIGS. 1 and 5, according to example embodiments. Comparing the arrays of the memory cells of FIGS. 6 and 7, in the array of FIG. 7, source lines SL12 through SL22 may not each commonly connect to two memory cells that belong to a single string and the memory cells may be arranged in a 6F2 structure.

Figure 8A:
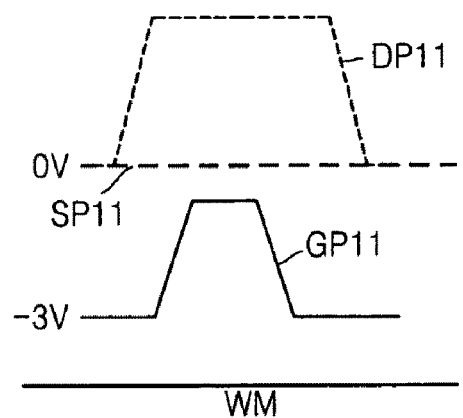
FIGS. 8A and 8B are diagrams illustrating write mode voltage pulses applied to a semiconductor device according to example embodiments.
Figure 8B:
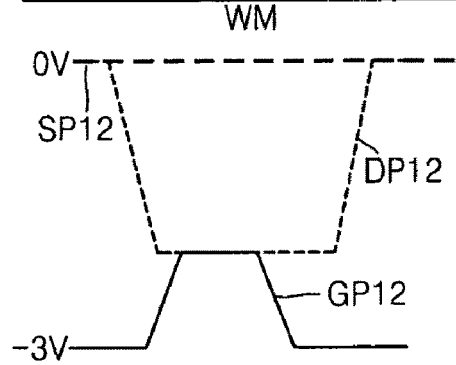

FIGS. 8A and 8B are diagrams illustrating write mode voltage pulses applied to a semiconductor device according to example embodiments, for example, FIGS. 6 and 7. Referring to the write mode WM of FIGS. 8A and 8B, gate voltage pulses GP11 and GP12 applied to the gate electrode 130 may transition from an enable voltage to a standby voltage and then drain voltage pulses DP11 and DP12 applied to the drain region 150 may transition from the enable voltage to the standby voltage. When both the drain voltage and the gate voltage are the enable voltage, the current may flow between the source region 140 and the drain region 150 due to the voltage difference between the source region 140 and the drain region 150, and carriers may be generated in the body region 170. When the gate voltage transitions from an enable voltage to a standby voltage which is a negative voltage (e.g., about −3V), the gate voltage may hold the carriers generated in the body region 170. When the gate voltage is the standby voltage, the carriers may be stored in the body region 170. The enable voltage means the enable-state voltage level and the standby voltage means the standby-state voltage level. The enable state is the state of a pulse which may be a positive pulse or a negative pulse. The standby state is a state that is not a pulse state. The standby voltage may be the hold voltage. The gate voltage pulses GP11 and GP12 may be applied to the memory cells via the word lines WL1-WL5 of FIGS. 6 and 7. The drain voltage pulse DP11 and DP12 may be applied to the memory cells via the bit lines BL1-BL4 of FIGS. 6 and 7. Source voltages SP11 and SP12 applied to the source region 140 may be constant voltage levels. FIGS. 8A and 8B illustrate source voltages SP11 and SP12 of about 0V. The source voltages SP11 and SP12 may be applied to the memory cells via the source lines SL1-SL3 of FIG. 6 or the source lines SL11-SL31 of FIG. 7.

Referring to FIGS. 8A, the enable-state voltage levels of the gate voltage pulse GP11 and the drain voltage pulse DP11 may be higher than the standby-state voltage levels thereof. The gate voltage pulse GP11 and the drain voltage pulse DP11 may be positive voltage pulses. In the WM of FIG. 8A, the standby and/or enable voltage level of the drain voltage pulse DP11 may be higher than that of the gate voltage pulse GP11. Referring to FIG. 8B, the enable-state voltage level of the gate voltage pulse GP12 may be higher than the standby-state voltage level thereof, and the enable-state voltage level of the drain voltage pulse DP12 may be lower than the standby-state voltage level of the drain voltage pulse DP12. The gate voltage pulse GP12 may be a positive pulse and the drain voltage pulse DP12 may be a negative pulse. In the WM of FIG. 8B, the standby and/or enable voltage level of the drain voltage pulse DP12 may be higher than that of the gate voltage pulse GP12.

Timing of when the drain voltage pulses DP11 and DP12 transition from the standby voltage to the enable voltage may be different from timing of when the gate voltage pulses GP11 and GP12 transition from the standby voltage to the enable voltage. For example, in FIGS. 8A and 8B, the drain voltage pulses DP11 and DP12 are shown as enabled earlier than the gate voltage pulses GP11 and GP12, but example embodiments are not limited thereto. The drain voltage pulses DP11 and DP12 may be enabled later than or at the same time as when the gate voltage pulses GP11 and GP12 are enabled. Intervals of time before and/or after the WM may be referred to as hold modes. Intervals of time before and/or after an erase mode EM and/or a read mode RM may also be referred to as hold modes.

Figure 9A:
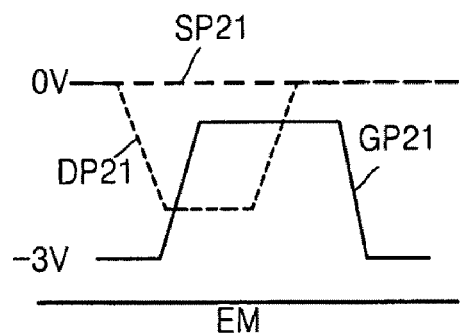
FIGS. 9A and 9B are diagrams illustrating erase mode voltage pulses applied to a semiconductor device according to example embodiments.
Figure 9B:
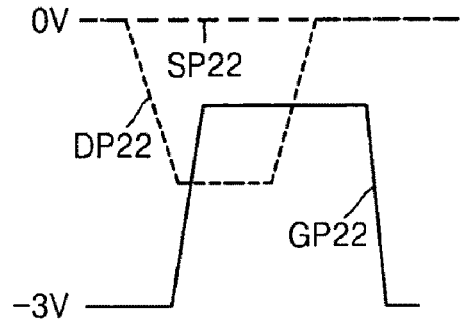

FIGS. 9A and 9B are diagrams illustrating erase mode EM voltage pulses applied to a semiconductor device according to example embodiments, for example, FIGS. 6 and 7. Referring to the EM of FIGS. 9A and 9B, drain voltage pulses DP21 and DP22 may transition from an enable voltage to a standby voltage, and then gate voltage pulses GP21 and GP22 may transition from an enable voltage to a standby voltage. When both the drain voltage and the gate voltage are the enable voltage, the current may flow between the source region 140 and the drain region 150 due to the voltage difference between the source region 140 and the drain region 150, and carriers may be generated in the body region 170. When the drain voltage transitions from an enable voltage to a standby voltage, the current may not flow between the source region 140 and the drain region 150 because the source voltage and the drain voltage are the same. Because the gate voltage is still an enable voltage after the drain voltage transitions from an enable voltage to a standby voltage, the gate voltage may not hold the carriers in the body region 170. The carriers may be removed from the body region 170 when the gate voltage is an enable voltage and the drain voltage is a standby voltage. When the gate voltage transitions from an enable voltage to a standby voltage, the gate voltage maintains a state where the carriers may not be stored in the body region 170. The gate voltage pulses GP21 and GP22 may be applied to the memory cells via the word lines WL1-WL5 of FIGS. 6 and 7. The drain voltage pulses DP21 and DP22 may be applied to the memory cells via the bit lines BL1-BL4 of FIGS. 6 and 7. Source voltages SP21 and SP22, which may be applied to the source region 140, may be constant. In FIGS. 9A and 9B the source voltages SP21 and SP22 are shown as a constant about 0V. The source voltages SP21 and SP22 may be applied to the memory cells via the source lines SL1-SL3 of FIG. 6 or the source lines SL11-SL31 of FIG. 7. Referring to FIG. 9A, the gate voltage pulse GP21 may be a positive pulse and the drain voltage pulse DP21 may be a negative pulse. Referring to FIG. 9B, the gate voltage pulse GP22 may be a positive pulse and the drain voltage pulse DP22 may be a negative pulse.

Timing of when the drain voltage pulses DP21 and DP22 transition from the standby voltage to the enable voltage may be different from timing of when the gate voltage pulses GP21 and GP22 transition from the standby voltage to the enable voltage. For example, in FIGS. 9A and 9B, the drain voltage pulses DP21 and DP22 are enabled earlier than the gate voltage pulses GP21 and GP22, but example embodiments are not limited thereto. The drain voltage pulses DP21 and DP22 may be enabled later than or at the same time as when the gate voltage pulses GP21 and GP22 are enabled.

Figure 10A:
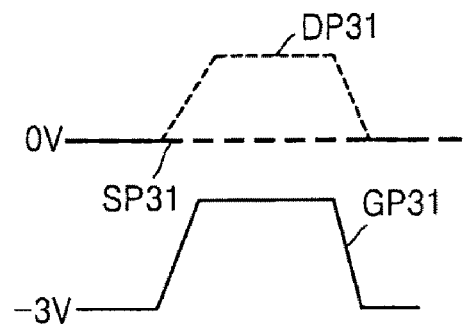
FIGS. 10A and 10B are diagrams illustrating read mode voltage pulses applied to a semiconductor device according to example embodiments.
Figure 10B:
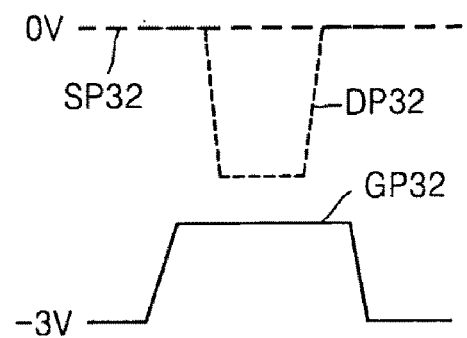

FIGS. 10A and 10B are diagrams illustrating read mode RM voltage pulses applied to a semiconductor device according to example embodiments, for example, FIGS. 6 and 7. Referring to the RM of FIGS. 10A and 10B, gate voltage pulses GP31 and GP32 and drain voltage pulses DP31 and DP32 having the pulse forms illustrated in FIGS. 10A and 10B may be applied. When both the drain voltage and the gate voltage are the enable voltage, the current may flow between the source region 140 and the drain region 150 due to the voltage difference between the source region 140 and the drain region 150. The amount of current flowing between the source region 140 and the drain region 150 may be measured and data may be read from the memory cell 100 of the 1T-DRAM. The enable voltage of the gate voltage in the read mode may be less than the enable voltage of the gate voltage in the write mode so as not to change the data in the memory cell 100 of 1T-DRAM before and after the read mode. The gate voltage pulses GP31 and GP32 may be applied to the memory cells via the word lines WL1-WL5 of FIGS. 6 and 7. The drain voltage pulses DP31 and DP32 may be applied to the memory cells via the bit lines BL1-BL4 of FIGS. 6 and 7. The source voltages SP31 and SP32, which may be applied to the source region 140, may be constant. In FIGS. 10A and 10B the source voltages SP31 and SP32 are shown as a constant about 0V. The source voltages SP31 and SP32 may be applied to the memory cells via the source lines SL1-SL3 of FIG. 6 or the source lines SL11-SL31 of FIG. 7. Referring to FIG. 10A, the gate voltage pulse GP31 and the drain voltage pulse DP31 may be positive pulses. Referring to FIG. 10B, the gate voltage pulse GP32 may be a positive pulse and the drain voltage pulse DP22 may be a negative pulse.

The source voltages in the read, write and erase modes may be constant and may be the same. For example, as described above, SP11 of FIG. 8A, SP12 of FIG. 8B, SP21 of FIG. 9A, SP22 of FIG. 9B, SP31 of FIG. 10A and SP32 of FIG. 10B may each be about 0V. According to semiconductor device operating methods of example embodiments, a source voltage may be maintained at a same constant voltage irrespective of the operating mode of the device. The number of operating voltages of a semiconductor device using the operating method may be reduced. If the source voltage varies according to the operating modes the number of operating voltages of a semiconductor device may increase to as many as the number of voltage levels of the source voltage.

Figure 11A:
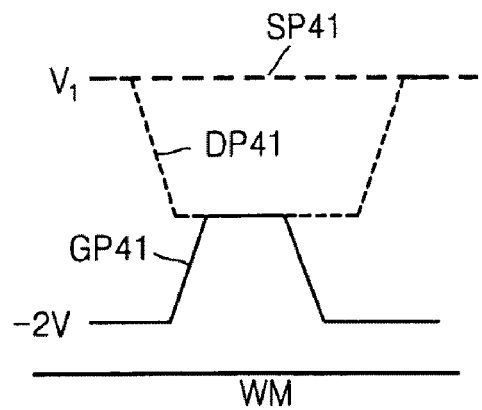
FIGS. 11A and 11B are diagrams illustrating write mode voltage pulses applied to a semiconductor device according to example embodiments.
Figure 11B:
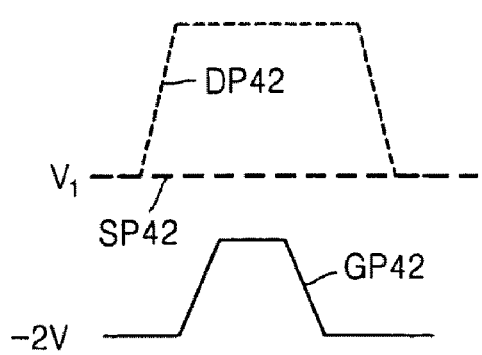
Figure 12A:
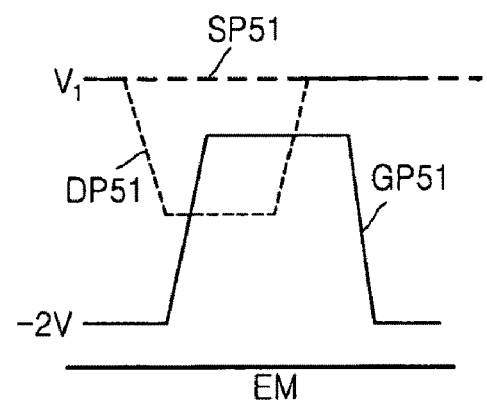
FIGS. 12A and 12B are diagrams illustrating erase mode voltage pulses applied to a semiconductor device according to example embodiments.
Figure 12B:
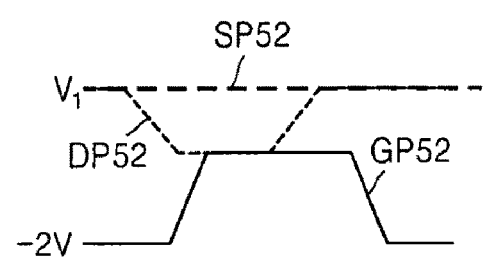
Figure 13A:
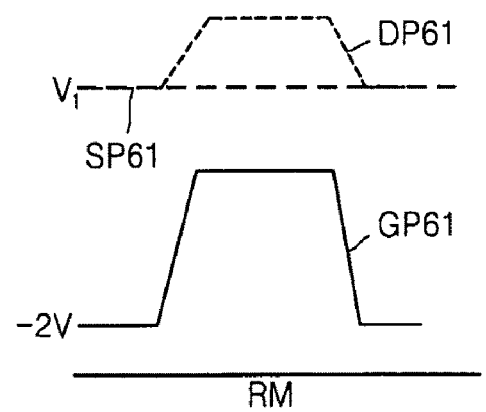
FIGS. 13A and 13B are diagrams illustrating read mode voltage pulses applied to a semiconductor device according to example embodiments.
Figure 13B:
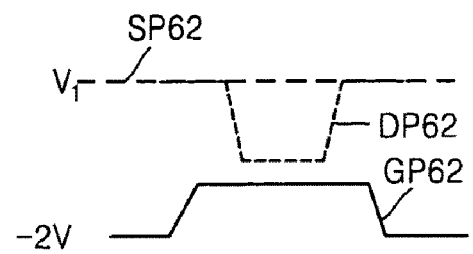

FIGS. 11A and 11B are diagrams illustrating write mode WM voltage pulses applied to a semiconductor device according to example embodiments, for example, FIGS. 6 and 7. FIGS. 12A and 12B are diagrams illustrating erase mode EM voltage pulses applied to a semiconductor device according to example embodiments, for example, FIGS. 6 and 7. FIGS. 13A and 13B are diagrams illustrating read mode RM voltage pulses applied to a semiconductor device according to example embodiments, for example, FIGS. 6 and 7. According to the semiconductor device operating method applied to the array of memory cells illustrated in FIGS. 6 and 7, the source voltages SP11, SP12, SP21, SP22, SP31 and SP32 may have fixed voltages of about 0V. According to the semiconductor device operating method applied to the array of memory cells illustrated in FIGS. 6 and 7, source voltages SP41, SP42, SP51, SP52, SP61 and SP62 may have fixed voltage levels other than about 0V. For example, the source voltages SP41, SP42, SP51, SP52, SP61, and SP62 may have fixed voltages greater than or smaller than about 0V.

Referring to FIGS. 11A through 13B, gate voltage pulses GP41, GP42, GP51, GP52, GP61 and GP62 and drain voltage pulses DP41, DP42, DP51, DP52, DP61 and DP62, of the semiconductor device operating method applied to the array of memory devices illustrated in FIGS. 6 and 7 may be similar to the gate voltage pulses and the drain voltage pulses in the semiconductor device operating method applied to example embodiments according to FIGS. 6 and 7 above except that the gate voltage pulses GP41, GP42, GP51, GP52, GP61 and GP62 and the drain voltage pulses DP41, DP42, DP51, DP52, DP61 and DP62 may have variable voltage levels, and thus a detailed description thereof is omitted. For example, referring to the WM of FIGS. 11A and 11B, the gate voltage pulses GP41 and GP42 may transition from the enable voltage to the standby voltage and then the drain voltage pulses DP41 and DP42 transition from the enable voltage to the standby voltage. On the other hand, referring to EM of FIGS. 12A and 12B, the drain voltage pulses DP51 and DP52 may transition from the enable voltage to the standby voltage, and then the gate voltage pulses GP51 and GP52 may transition from the enable voltage to the standby voltage. Referring to the RM of FIGS. 13A and 13B, gate voltage pulses GP61 and GP62 and drain voltage pulses DP61 and DP62 having the pulse forms illustrated in FIGS. 13A and 13B may be applied. Gate voltage pulses GP61 and GP62, drain voltage pulses DP61 and DP62, and source voltages SP61 and SP62 illustrated in FIGS. 13A and 13B may be variations of the voltage pulses illustrated in FIGS. 10A-10B, and a detailed description thereof is omitted.

FIGS. 14A-14E are diagrams illustrating variations of write mode WM voltage pulses that may be applied according to example embodiments, for example, FIGS. 6 and 7. Referring to FIGS. 14A-14E, gate voltage pulses GP71-GP75 may transition from the enable voltage to the standby voltage and then drain voltage pulses DP71-DP75 may transition from the enable voltage to the standby voltage. Source voltages SP71-SP75 may be set to have constant voltages. According to FIGS. 14A and 14B, the source voltages SP71 and SP72 may have fixed voltages of about 0V. According to FIGS. 14C, 14D and 14E, the source voltages SP73, SP74 and SP75 may have fixed voltages higher than about 0V. The gate voltage pulses GP71-GP75 and the drain voltage pulses DP71-DP75 may be positive and/or negative pulses.

FIGS. 15A-15E are diagrams illustrating variations of erase mode EM voltage pulses according to example embodiments, for example, FIGS. 6 and 7. Referring to FIGS. 15A through 15E, drain voltage pulses DP81-DP85 may transition from the enable voltage to the standby voltage and then gate voltage pulses GP81-GP85 may transition from the enable voltage to the standby voltage. Source voltages SP81-SP85 may be set to have constant voltages. According to FIGS. 15A, 15B and 15C, the source voltages SP81, SP82 and SP83 may have fixed voltages of about 0V. According to FIGS. 15D and 15E the source voltages SP84 and SP85 may have fixed voltage levels higher than about 0V. The gate voltage pulses GP81-GP85 and the drain voltage pulses DP81-DP85 may be positive and/or negative pulses.

The enable voltage and standby voltage levels of the gate voltage pulses GP71-GP75 and GP81-GP85, and the drain voltage pulses DP71-DP75 and DP81-DP85 illustrated in FIGS. 14A-15E are examples. The gate voltage pulses GP71-GP75 and GP81-GP85, and the drain voltage pulses DP71-DP75 and DP81-DP85 may be other voltage levels.

Figure 16A:
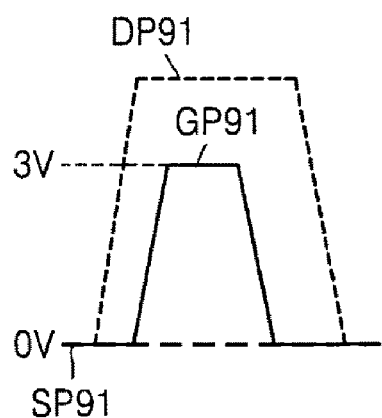
FIGS. 16A and 16B are diagrams illustrating write mode voltage pulses according to example embodiments.
Figure 16B:
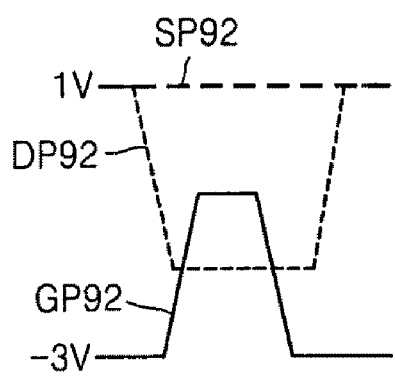
Figure 17A:
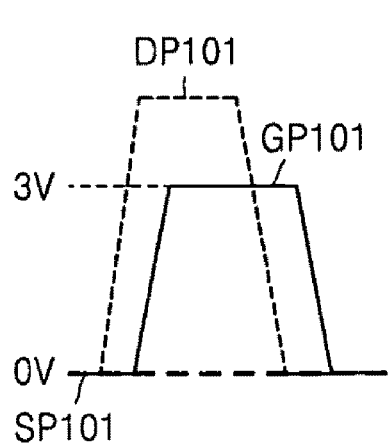
FIGS. 17A and 17B are diagrams illustrating erase mode voltage pulses according to example embodiments.
Figure 17B:
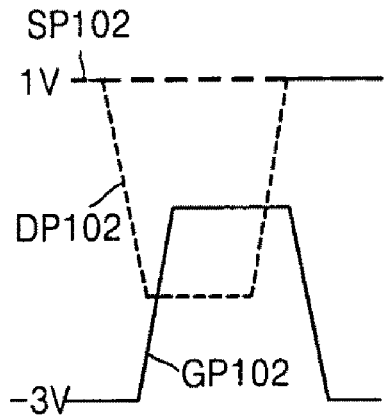
Figure 18A:
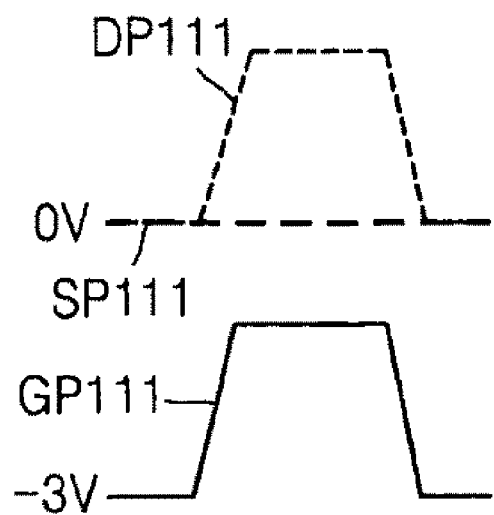
FIGS. 18A and 18B are diagrams illustrating read mode voltage pulses according to example embodiments.
Figure 18B:
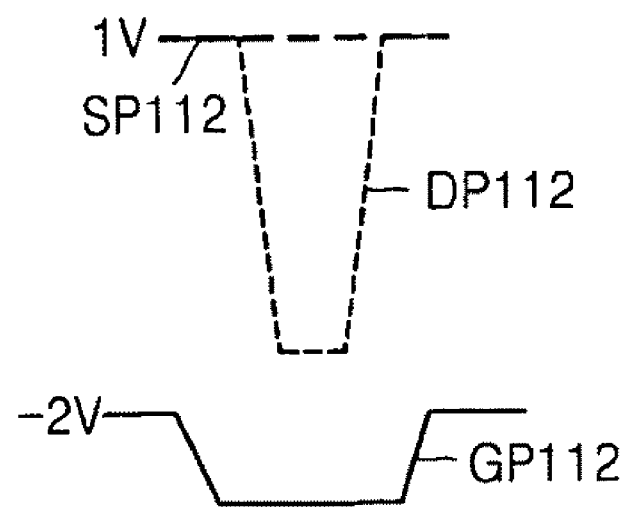

FIGS. 16A and 16B are diagrams illustrating variations of write mode WM voltage pulses according to example embodiments, for example, FIGS. 6 and 7. Gate voltage pulses GP91 and GP92, drain voltage pulses DP91 and DP92, and source voltages SP91 and SP92 illustrated in FIGS. 16A and 16B may be variations of the voltage pulses illustrated in FIGS. 8A-8B, 11A-11B, and 14A-14E, and a detailed description thereof is omitted. FIGS. 17A and 17B are diagrams illustrating variations of erase mode EM voltage pulses according to example embodiments, for example, FIGS. 6 and 7. Gate voltage pulses GP101 and GP102, drain voltage pulses DP101 and DP102, and source voltages SP101 and SP102 illustrated in FIGS. 17A and 17B may be variations of the voltage pulses illustrated in FIGS. 9A-9B, 12A-12B, and 15A-15E, and a detailed description thereof is omitted. FIGS. 18A and 18B are diagrams illustrating variations of read mode RM voltage pulses according to example embodiments, for example, FIGS. 6 and 7. Gate voltage pulses GP111 and GP112, drain voltage pulses DP111 and DP112, and source voltages SP111 and SP112 illustrated in FIGS. 18A and 18B may be variations of the voltage pulses illustrated in FIGS. 10A-10B and 13A-13B, and a detailed description thereof is omitted.

Amplitudes of the above-described gate voltage pulses and the above-described drain voltage pulses may vary. For example, the amplitudes of the gate voltage pulses applied in the EM may be equal to those of the gate voltage pulses applied in the WM. The amplitudes of the drain voltage pulses applied in the EM may be equal to those of the drain voltage pulses applied in the WM. In the EM and the WM, the widths of the gate voltage pulses may be smaller than, equal to, or greater than those of the drain voltage pulses. The widths of the gate voltage pulses may be different from those of the above-described source voltages. The above-described voltage pulses may be applied to the 1T-DRAM 100 of FIG. 1, and may also be applied to a 1T-DRAM 1900 and a 1T-DRAM 2000 illustrated in FIGS. 19 and 20, respectively.

Figure 19:
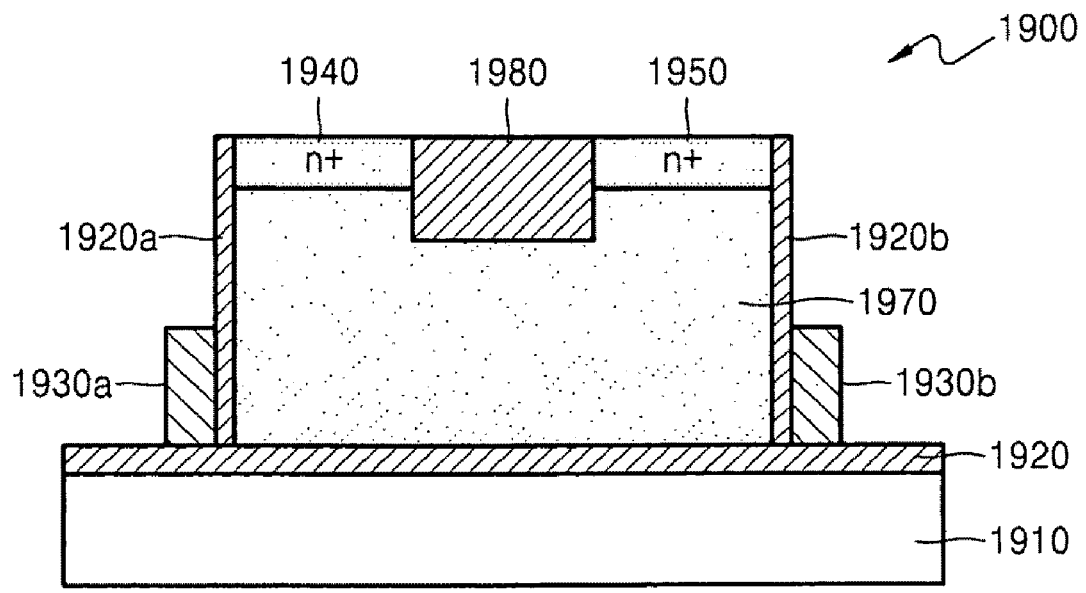
Figure 20:
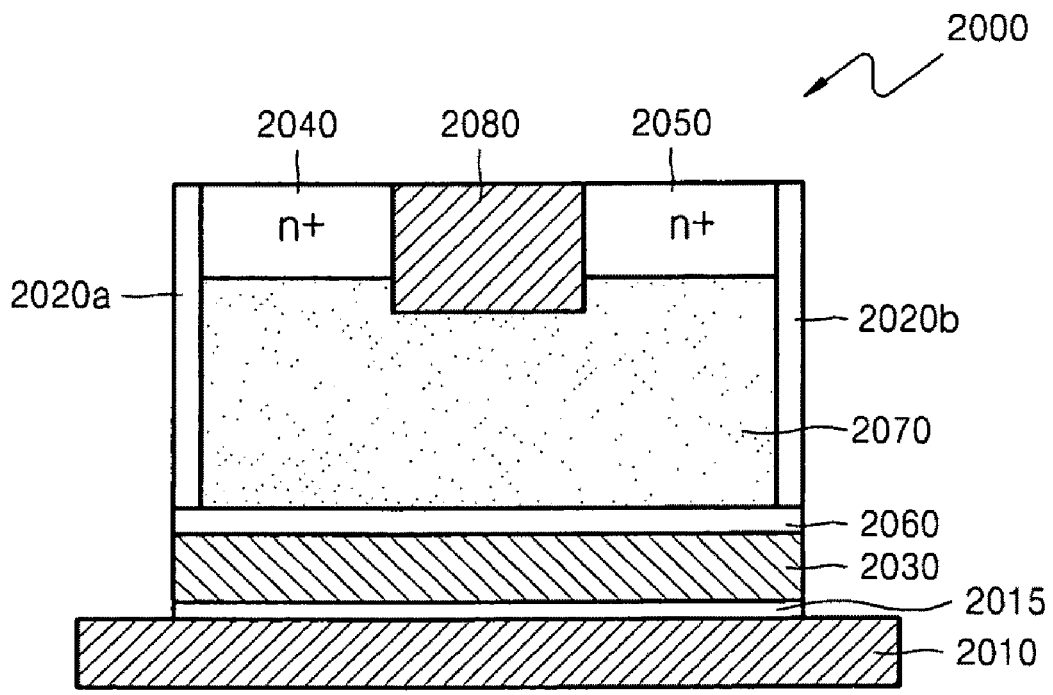

FIGS. 19 and 20 are cross-sectional diagrams of an example memory cell of a 1T-DRAM according to example embodiments. Referring to FIG. 19, semiconductor device operating methods according to example embodiments may be applicable to a 1T-DRAM 1900 which may include a semiconductor substrate 1910, an insulating layer 1920, a body region 1970, gate patterns 1930a and 1930b, a first impurity-doped region 1940, and a second impurity-doped region 1950. The body region 1970 may be on the insulating layer 1920. The gate patterns 1930a and 1930b may be on the insulating layer 1920 and on each side surface of the body region 1970. The first and second impurity-doped regions 1940 and 1950 may be in and/or on an upper part of the body region 1970. The first and second impurity-doped regions 1940 and 1950 may be a drain region and/or a source region.

The gate patterns 1930a and 1930b may extend in a direction perpendicular to the first and second impurity-doped regions 1940 and 1950 and may be a distance apart from the first and second impurity-doped regions 1940 and 1950. Accordingly, the gate patterns 1930a and 1930b may not be overlapped with the first and second impurity-doped regions 1940 and 1950. The gate patterns 1930a and 1930b may extend in a direction perpendicular to the longer side of the body region 1970. For example, the gate patterns 1930a and 1930b may extend in a direction crossing the longer side of the body region 1970. The first and second impurity-doped regions 1940 and 1950 may protrude from the body region 1970 and be separated from each other. A blocking oxide region 1980 may be between the first and second impurity-doped regions 1940 and 1950. The blocking oxide region 1980 may be formed of a material including an oxide. However, the blocking oxide region 1980 may be replaced by an insulation region including an insulation material. Oxide regions described in the specification may be replaced by insulation regions formed of insulation materials.

The 1T-DRAM 1900 may further include gate insulation regions 1920a and 1920b. The gate insulation region 1920a may be between the gate pattern 1930a and the body region 1970 and the gate insulation region 1920b may be between the gate pattern 1930b and the body region 1970. The gate insulation regions 1920a and 1920b may insulate the gate patterns 1930a and 1930b, respectively, from the body region 1970. The 1T-DRAM 1900 may further include a buried oxide (BOX) region (not shown) formed on the substrate region 1910. The BOX region may be an oxide region on the substrate region 1910. For example, the oxide region may be an oxide formed from a bulk substrate (not shown). Alternatively, an insulation region of a Silicon-On-Insulator (SOI) substrate may be used as the BOX region.

Referring to FIG. 20, semiconductor device operating methods according to example embodiments may be applicable to a 1T-DRAM 2000 which may include a semiconductor substrate 2010, a gate pattern 2030, an insulating layer 2060, a body region 2070, a first impurity-doped region 2040 and a second impurity-doped region 2050. The gate pattern 2030 may be on the semiconductor substrate 2010. The body region 2070 may be on the gate pattern 2030. The first and second impurity-doped regions 2040 and 2050 may be in and/or on an upper part of the body region 2070. The gate pattern 2030 may be below the body region 2070 and the first and second impurity-doped regions 2040 and 2050. The body region 2070 may be a floating body region separated from the substrate region 2010. The body region 2070 and the substrate region 2010 may be formed of materials having the same characteristics.

The 1T-DRAM 2000 may further include a BOX region 2015 formed on the substrate region 2010. The 1T-DRAM 2000 may further include first insulation regions 2020a and 2020b. The first insulation regions 2020a and 2020b may be on a side surface of the body region 2070. The first insulation regions 2020a and 2020b may be on a side surface of the gate pattern 2030 and on a side surface of the body region 2070. The first insulation regions 2020a and 2020b may insulate the body region 2070 from the surroundings or insulate the gate pattern 2030 and the body region 2070 from their surroundings.

Methods of operating semiconductor devices according to one or more embodiments may include applying a constant source voltage to a source line, thereby reducing the number of operating voltages of a semiconductor device. While example embodiments have been particularly shown and described, it will be understood by one of ordinary skill in the art that variations in form and detail may be made therein without departing from the spirit and scope of the claims.

What is claimed is:

1. A method of operating a semiconductor device including a plurality of memory cells, each memory cell including a drain region, a source region, a floating body region, and a gate electrode, the method comprising:
    erasing at least one of the memory cells in an erase mode and setting a data value of the at least one of the memory cells to a first state, by transitioning a drain voltage pulse applied to the drain region from an enable voltage to a standby voltage and a gate voltage pulse applied to the gate electrode from an enable voltage to a standby voltage;
    writing to the at least one of the memory cells in a write mode and setting the data value of the at least one of the memory cells to a second state, by transitioning a gate voltage pulse applied to the gate electrode from an enable voltage to a standby voltage and then a drain voltage pulse applied to the drain region from an enable voltage to a standby voltage; and
    applying a constant source voltage to the source region in the erase mode and the write mode, respectively.

2. The method of claim 1, wherein the source voltage is a ground voltage.

3. The method of claim 1, wherein the source voltage is not a ground voltage.

4. The method of claim 1, further comprising:
    reading the data value of the at least one of the memory cells in a read mode,
    wherein the source voltage has a constant voltage in the read mode or has a constant voltage in the erase mode, the write mode, and a hold mode, respectively.

5. The method of claim 1, wherein each of a plurality of source lines of the semiconductor device is commonly connected to source regions of at least two of the plurality of memory cells; and
    the constant source voltage is applied via the commonly connected source lines.

6. The method of claim 1, wherein in the erase mode and the write mode the gate voltage pulse is transitioned from the standby voltage to the enable voltage one of earlier than or at the same time as the drain voltage pulse is transitioned from the standby voltage to the enable voltage.

7. The method of claim 1, wherein in the erase mode and the write mode the gate voltage pulse is transitioned from the standby voltage to the enable voltage after the drain voltage pulse is transitioned from the standby voltage to the enable voltage.

8. The method of claim 1, wherein:
    the first state is "0"; and
    the second state is "1".

9. The method of claim 1, wherein in the erase mode and the write mode a width of the gate voltage pulse is less than a width of the drain voltage pulse.

10. The method of claim 1, wherein in the erase mode and the write mode a width of the gate voltage pulse is equal to a width of the drain voltage pulse.

11. The method of claim 1, wherein in the erase mode and the write mode, a width of the gate voltage pulse is greater than a width of the drain voltage pulse.

12. The method of claim 1, wherein in the erase mode or the write mode the gate voltage pulse is a positive pulse or a negative pulse, and
    the drain voltage pulse is a positive pulse.

13. The method of claim 1, wherein in the erase mode or the write mode the gate voltage pulse is a positive pulse or a negative pulse, and
    the drain voltage pulse is a negative pulse.

14. A 1-transistor dynamic random access memory (1T-DRAM) operated according to the method of claim 1.

15. The method of claim 1, wherein each of the memory cells further includes a semiconductor substrate,
    the floating body region on the semiconductor substrate,
    gate electrodes on the semiconductor substrate and on side surfaces of the floating body region, and
    first and second impurity-doped regions on an upper part of the floating body region.

16. The method of claim 15, wherein the gate electrodes are in a direction perpendicular to and a distance apart from the first and second impurity-doped regions, and
    the gate electrodes are not overlapped with the first and second impurity-doped regions.

17. The method of claim 1, wherein each of the memory cells further includes a semiconductor substrate,
    a gate electrode on the semiconductor substrate,
    the floating body region on the gate electrode, and
    first and second impurity-doped regions on an upper part of the floating body region.

18. A semiconductor device comprising:
    a plurality of memory cells each including a drain region, a source region, a floating body region, and a gate electrode; and
    a plurality of common source lines each commonly connected to source regions of at least two of the plurality of memory cells, wherein each memory cell is configured so that in an erase mode where a data value of each memory cell is changed to a first state, a drain voltage pulse applied to the drain region transitions from an enable voltage to a standby voltage, and then a gate voltage pulse applied to the gate region transitions from an enable voltage to a standby voltage, in a write mode where the data value of each memory cell is changed to a second state, a gate voltage pulse applied to the gate region transitions from an enable voltage to a standby voltage, and then a drain voltage pulse applied to the drain region transitions from an enable voltage to a standby voltage, and a source voltage applied to the source region is constant in the erase mode and the write mode, respectively.

19. The semiconductor device of claim 18, wherein the source voltage is not a ground voltage.

20. The semiconductor device of claim 18, wherein the source voltage is a ground voltage.

21. The semiconductor device of claim 18, wherein each memory cell is configured to maintain the source voltage that is constant in a read mode, or is constant in the erase mode, the write mode, and a hold mode, respectively.

22. The semiconductor device of claim 18, wherein in the erase mode and the write mode the gate voltage pulse is transitioned from the standby voltage to the enable voltage one of earlier than or at the same time as the drain voltage pulse is transitioned from the standby voltage to the enable voltage.

23. The semiconductor device of claim 18, wherein in the erase mode and the write mode the gate voltage pulse is transitioned from the standby voltage to the enable voltage after the drain voltage pulse is transitioned from the standby voltage to the enable voltage.

* * * * *